United States Patent [19]

Blank et al.

[11] Patent Number: 4,638,246
[45] Date of Patent: Jan. 20, 1987

[54] INTEGRATED CIRCUIT INPUT-OUTPUT DIAGNOSTIC SYSTEM

[75] Inventors: Hans G. Blank, Chestnut Hill; Jeffrey R. Fox, Concord, both of Mass.

[73] Assignee: GTE Laboratories Incorporated, Waltham, Mass.

[21] Appl. No.: 653,441

[22] Filed: Sep. 21, 1984

[51] Int. Cl.<sup>4</sup> ............................................. G01R 17/02
[52] U.S. Cl. .................................... 324/73 R; 371/21
[58] Field of Search ............ 324/73 R, 73 AT, 158 R, 324/57 R; 371/11, 21, 24, 25

[56] References Cited

U.S. PATENT DOCUMENTS

| | | | |
|---|---|---|---|
| 3,281,673 | 10/1966 | Richardson | 324/57 R |
| 3,772,595 | 11/1973 | De Wolf et al. | 324/73 |
| 3,801,905 | 4/1974 | Baker et al. | 324/73 |
| 4,038,648 | 7/1977 | Chesley | 371/11 |
| 4,176,258 | 11/1979 | Jackson | 371/25 |
| 4,180,772 | 12/1979 | Buelow et al. | 324/73 |
| 4,183,460 | 1/1980 | Yuen et al. | |
| 4,244,048 | 1/1981 | Tsui | 371/25 |
| 4,395,757 | 7/1983 | Van Brunt et al. | 371/25 |
| 4,495,642 | 1/1985 | Zellmer | 324/73 AT |
| 4,504,929 | 3/1985 | Takamae | 371/21 |

Primary Examiner—Reinhard J. Eisenzopf
Assistant Examiner—William J. Burns
Attorney, Agent, or Firm—Hamilton, Brook, Smith & Reynolds

[57] ABSTRACT

Input and output fault monitoring circuits for determining the presence of integrated circuit chip open connections at the input and output pads of each circuit on a chip. The input fault monitoring circuit operates on the principle that if there is no input signal from the input pad throughout the known duty cycle or frequency of the input circuit, a defect, such as an open circuit interconnect, has occurred. The output fault monitoring circuit generates a signal through a dummy circuit connected to the output circuit which has a time delay intermediate that of the output circuit operating into a connected output pad and that of the output circuit when operating into a disconnected pad. Thus, the time of arrival of the dummy circuit signal in relation to that of the actual output signal is used to indicate the presence or absence of a disconnected output pad.

11 Claims, 5 Drawing Figures

4,638,246

INTEGRATED CIRCUIT INPUT-OUTPUT DIAGNOSTIC SYSTEM

DESCRIPTION

1. Technical Field

This invention relates to means for testing and diagnosing integrated circuits (chips) and relates in particular to apparatus for locating open (disconnected) input or output terminals at the input and output pads of a chip.

2. Background Art

With the ever increasing micro miniaturization of integrated semiconductor circuits and the attendant increased density of such circuits, the unit costs per chip is increasing at a very rapid pace. As the technology has evolved from so-called "MSI" (medium scale integration) to "LSI" (large scale integration) of integrated circuit chips, the active circuits of the chips have become more and more reliable. Consequently, it has been recognized that a large percentage of the failures of such chips occurs in the area of the interconnections between chips and particularly in the area of the metallic pads on the surface of the chip where contact is made with external wiring. It is estimated that perhaps 90% of the failures occurring in integrated circuits are due to bond failures or open-solder joints occurring at the input or output pads of chips. These failures cause open circuits between the input and output pads on the chips and the external apparatus on the chip carriers.

In U.S. Pat. No. 4,183,460, an input open circuit detector is described comprising a pair of current mode logic (CML) gates, one of which continually senses the state of the input lead of the chip and in one state continually draws a predetermined minimal amount of current from the output of another chip so as to continually sense the continuity of the connection to the input lead. An output short detector is also provided to continually monitor a pair of output leads through a voltage divider network to establish a voltage difference in the event that one or the other of the leads become shorted, which voltage difference causes a first sensor CML gate to change its normal state and, in turn, causes the second CML gate to send a warning signal to an output test and diagnostic pin, by reason of the second gate changing its normal state.

U.S. Pat. No. 4,395,767 provides an interconnect fault detector for LSI logic chips which is directed to emitter couple logic (ECL) chips. In the '767 patent, a level sensor is provided on each individual chip for each input and output pin. The individual level sensors are connected to one or more comparators, each of which is provided with a predetermined detection threshold voltage input. When the output of a level sensor associated with a chip varies from the threshold detection voltage of the comparator, a fault report signal is generated.

The above-referenced patents are directed towards integrated circuit chips implemented in bi-polar transistor circuits. Although the present invention can be used to advantage with other types of transistor circuits such as bi-polar, the present invention finds particular application in the testing and diagnosis of circuits of metal-oxide semiconductor (MOS) type of construction. As used herein, the term "MOS" device refers to a device constructed with metal-oxide semiconductors and the term MOSFET to an MOS field effect transistor. Typically, a MOSFET device has a source S and a drain D connected by a narrow channel of semiconductor material. A conductive gate G is placed in the channel but is insulated from the semiconductor material with a thin layer of silicon dioxide ($SiO_2$) that has a substantial resistivity. The $SiO_2$ is so thin that an electrostatic field produced by a bias voltage on the gate still penetrates and controls the conductivity of the channel.

Because of the $SiO_2$ layer at the gate, MOS field effect transistors have a high input impedance. Such devices can be used for low frequency applications but their primary use is in high speed switching circuits, RF circuits, linear integrated circuits and digital integrated circuits. One of their primary advantages over bi-polar circuits is their lower current and, hence, lower power dissipation resulting in their application to higher density logic circuits.

Consequently, it would be highly desirable to provide low cost, simple and effective input and output open circuit detector circuits compatible with MOS devices which can be implemented on a chip.

SUMMARY OF THE INVENTION

In accordance with the invention, a plurality of input activity detectors and output load detectors, one for each chip pin being monitored, are individually coupled to the respective input and output pads of the chips.

The input activity detector operates on the principle that if there is no input signal from the input pad throughout the known duty cycle or frequency of the input circuit, a defect such as an open circuit interconnect has occurred. Thus, a MOSFET circuit is included on the chip in parallel with the input circuit which integrates the input signal. The integrated signal is compared in an error amplifier with a pre-set reference voltage. If the integrated voltage signal drops below the reference voltage, the output of the error amplifier is Zero volts indicating the presence of an open circuit. If the level is equal to or above the reference voltage, a voltage output level occurs at the output of the error amplifier, indicating proper operation of the input circuit. In summary, by integrating the input signal with an integration time constant matched to the frequency of the input signal, a voltage appears at the output of each input activity detector, as long as the input pin is intermittently activated. If the input lead becomes disconnected, the voltage is lost and a fault signal is generated.

The output load detector operates under the principle that, especially in chips implemented in MOS technology, when the chip output pad is connected to external apparatus a significantly large load capacity, i.e., in the order of 10–50 picofarads, is presented to the output circuit. Thus, if the pad is disconnected from the output circuit, the output circuit will operate faster than normal. An on-chip "dummy" output circuit is connected in parallel with the "real" output circuit. The dummy circuit comprises a driver which operates into an on-chip capacitor. The dummy circuit capacitor and driver capacitance has a time constant shorter than the loaded circuit time constant, but longer than the unloaded (open circuit) time constant. By comparing the time of occurrence of the real output signal with the time of occurrence of the dummy signal, a failure signal is developed when the real output signal occurs before the dummy output signal.

Each input and output monitoring circuits on a chip may be NAND'D in an on-chip NAND gate and coupled to an on-chip NAND gate output fault monitor similar to the above for a total check of the chip. Furthermore, the outputs of all NAND gate fault monitors of each chip on a board may be NOR'D in a board monitor circuit to determine a total board fault status.

BEST MODE OF CARRYING OUT THE INVENTION

The present invention is discussed by way of example with reference to metal-oxide semiconductor field effect transistor (MOSFET) semiconductor technology commonly found in large scale integration (LSI) logic and communication systems. Clearly, other technology is envisioned in connection with the invention, such as bi-polar transistor technology.

Figure 1:
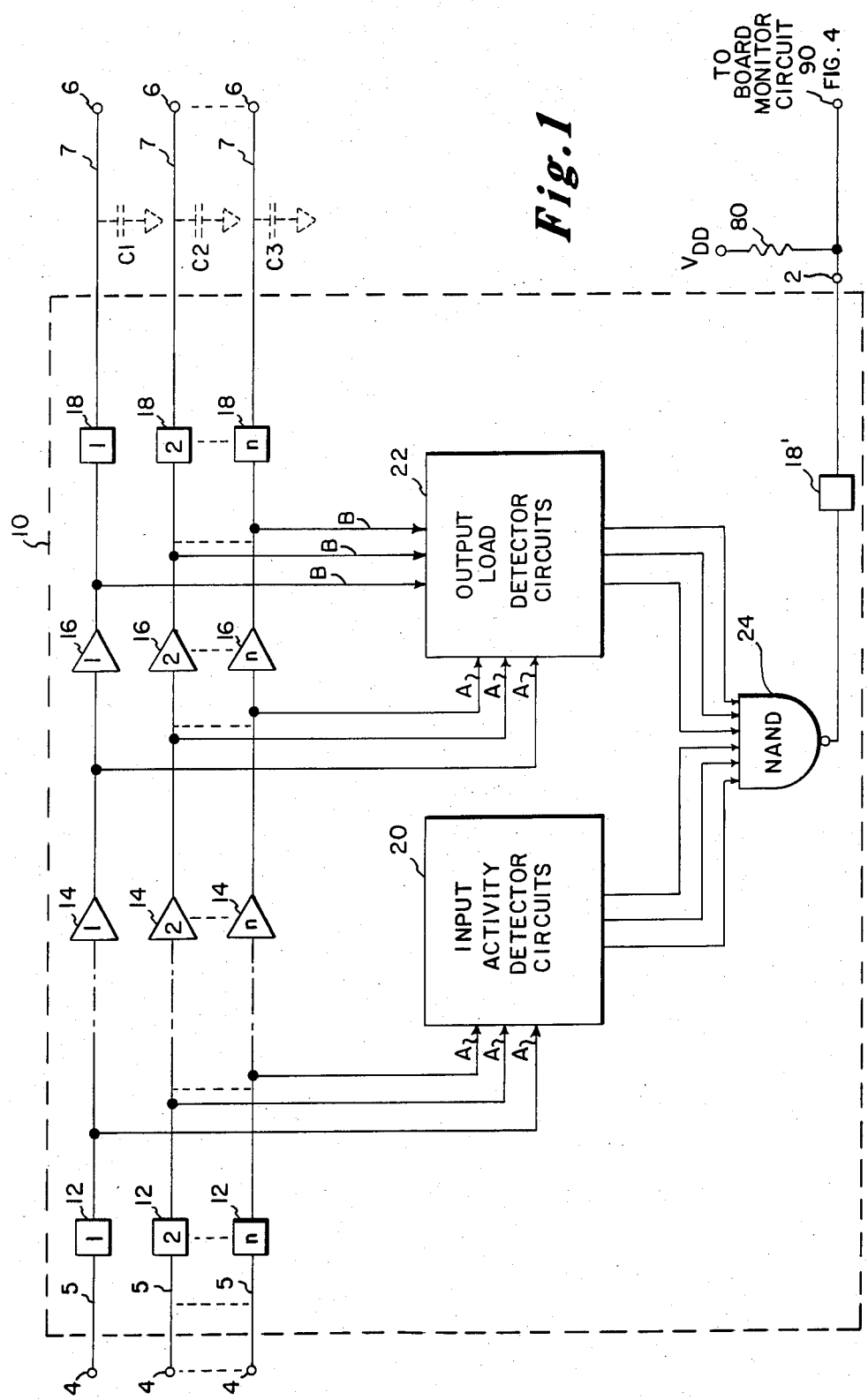
FIG. 1 is a block diagram of a integrated circuit chip with an input activity detector circuit and an output fault detector circuit of the invention incorporated therein.

Referring now to FIG. 1, the numeral designation 10 indicates in dotted lines the integrated circuit chip. Field effect transistor chips may incorporate more than 100,000 transistors per chip. Typically, the input leads 4 and the output leads 6 of each circuit within a chip, are coupled from respective input and output metallic pads 12 and 18 on the surface of the chip by external wires to a chip carrier (not shown). Three such input and output metallic pads 12 and 18 labelled 1, 2 and n (representing n number of such pads), for each circuit on a chip are shown in FIG. 1. Typically, an input signal on pin 4 of the chip carrier is coupled from the chip carrier to the input pad 12 by bonding wire 5 and thence to a transistor circuit 14, such as a driver amplifier. The amplified signal is further processed as shown by the dotted lines, and then coupled to an output amplifier or driver 16 to output pad 18 and to terminal 6 on the external chip carrier or circuit board by bonding wire 7.

The purpose of the invention is to provide an apparatus and method for determining if an open circuit has developed between the bonding pads 12 and the chip carrier terminals 4 of each of the integrated circuits within the chip; and likewise, to determine if an open circuit exists between the output driver amplifier pads 18 and the chip carrier terminals 6. Such open circuits occur principally because of defective bonding of the wires 5 and 7 to the respective pads 4 and 6.

Accordingly, there is provided between the input pad 12 and the input circuit 14 a wire coupling to an input activity detector circuit 20 for each of the input circuits of the integrated circuit. Similarly, an output load detector circuit 22 is provided across each of the output amplifier driver circuits 16 of the integrated circuit chip 10. These input activity detector circuits 20 and output load detector circuits 22 will now be described in connection with FIGS. 2 and 3.

Figure 2:
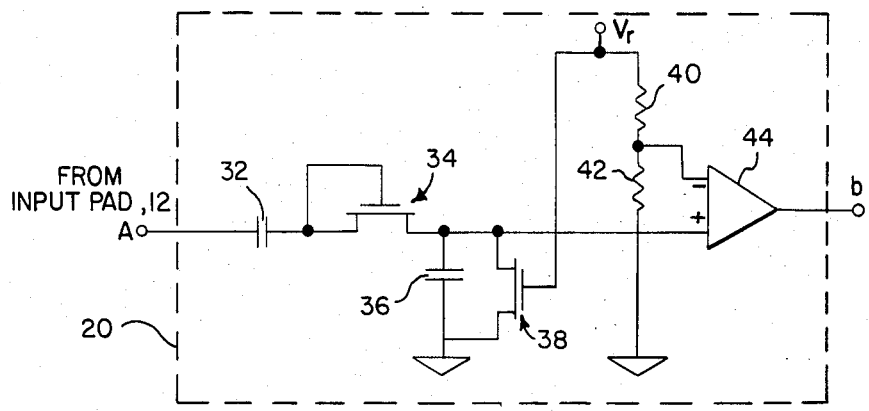
FIG. 2 is a schematic of a typical input activity detector circuit.

FIG. 2 shows a typical input activity detector circuit in accordance with the invention. It should be kept in mind that one such circuit is provided for each of the input and output circuits on the chip. As shown in FIG. 2, the input signal from input pad 12 is coupled through a DC blocking capacitor 32, a diode connected MOSFET transistor 34 and an integrating capacitor 36, which together form an integrating circuit with a time constant greater than the predetermined duty cycle of the input signal. Thus, as long as a signal occurs at the input lead A from input pad 12 to the input activity detector within the known frequency or duty cycle of the input signal, a voltage drop will occur across integrator discharge MOSFET transistor 38 which will be coupled to the + input terminal of error amplifier 44. It should be noted that a parasitic diode (not shown) is found between the drain terminal of transistor 34 and the circuit substrate. The parasitic diode prevents a positive charge from accumulating across capacitor 32.

The gate of integrated discharge MOSFET transistor 38 is biased by reference voltage $V_r$. A voltage divider circuit comprising resistors 40 and 42 provides a reference voltage to the negative input lead to error amplifier 44. Note that the polarities shown assume an N-channel transistor is used in error amplifier 44. Thus, a reference voltage is set at one input to the error amplifier 44 below which no output signal will occur from the error amplifier 44, thus indicating that no activity occurred at the input to the circuit during the predetermined time constant of the input signal and, therefore, a defect is indicated by the zero signal. If the + voltage to the error amplifier is equal to or above the preset negative reference point to the error amplifier 44, a voltage output or a logic one is provided from the amplifier indicating that the circuit is operative.

Figure 3:
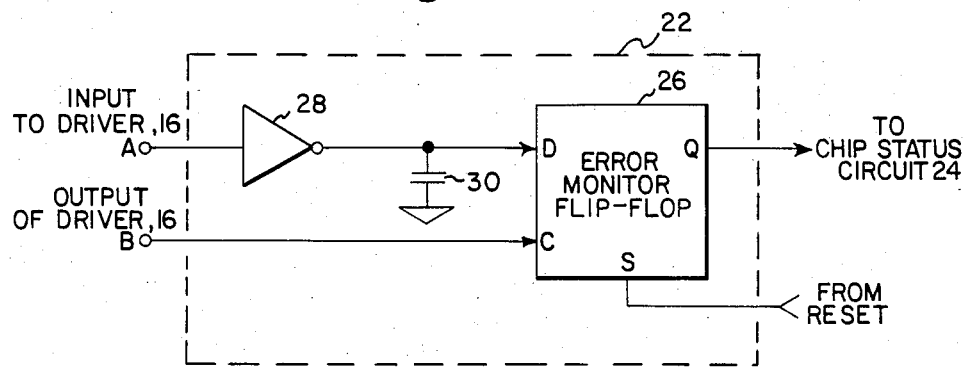
FIG. 3 is a schematic of a typical output load detector circuit of the invention.

The details of the output load detector circuit 22 will be described in connection with FIG. 3 and FIG. 5. As shown in FIG. 3, there are two inputs to the output load detector circuit 22; an A input and a B input. The A input is taken from the input lead to the output driver circuit 16. The B input is taken from the output lead of the output driver circuit 16. In this manner, the dummy driver circuit 28 is coupled in parallel with the actual driver circuit 16. Dummy driver circuit 28 is a scaled-down version of the actual driver circuit 16. In other words, if the amplifier 16 has a drive capacity of 10 picofarads, the dummy circuit need only have a drive capacity of, for example, 1 picofarad, and thus may be fabricated in MOS technology in a very small chip space. The time constant of dummy driver circuit 28 is shorter than that of the "real" or actual driver circuit 16 when operating into the large load capacity C1, C2 or C3, shown in dotted lines in FIG. 1.

Capacitor 30 is of a much less capacity than the load capacity C1, shown in dotted lines in FIG. 1. For example, if the load capacity C1 is ten picofarads, the dummy load capacitor 30 would have a capacitance of about 0.8 picofarads. Thus, the leading edge of the voltage waveform of the driver 18, when connected to pad 18, i.e., when operating into the capacitive load C1, starts at $T_L$, for curve L of FIG. 5 sometime later than the leading edge of the input to driver 16, shown as curve A. The corresponding leading edge of the dummy circuit, driver 28 voltage waveform, will be delayed to a time of $T_D$, as shown in curve D of FIG. 5. This time $T_D$ is less than $T_L$ because the time constant of the dummy circuit is less than the time constant of the real circuit operating into load capacitance C1. Likewise, the trailing edge of the output driver circuit 16, for normal operation, will occur at $T_{1L}$ when operating in the load capacitor C1 while the trailing edge of the dummy circuit driver 28 occurs sometime earlier at the point designated $T_{1D}$.

The output of driver 16 on line B is coupled to the C input of a D-type flip-flop 26 and the output of the dummy circuit driver operating into dummy load capacitor 30 is coupled to the D terminal of error monitor flip-flop 26. The D input terminal stands for delay or data. The D-type flip-flop has an output that is a function of the D input that occurred one clock pulse earlier. A "One" present at the D input during a clock pulse will cause the Q output of the flip-flop to go to a "One". If the D input is a "Zero" during the next clock pulse, the Q output goes back to "Zero".

The truth table of the D-type flip-flop is shown below in Table 1:

TABLE 1

| S | Clock | D | Q |
|---|-------|---|---|
| L | X | X | H |
| H | ↑ | H | H |
| H | ↑ | L | L |
| H | L | X | $Q_o$ |

Preferably, the flip-flop 26 should include Schmitt trigger circuit at the D and C input circuits with hysteresis to avoid ambiguity in data. To reset the flip-flop 26, the S input terminal is enabled by a reset pulse.

Figure 5:
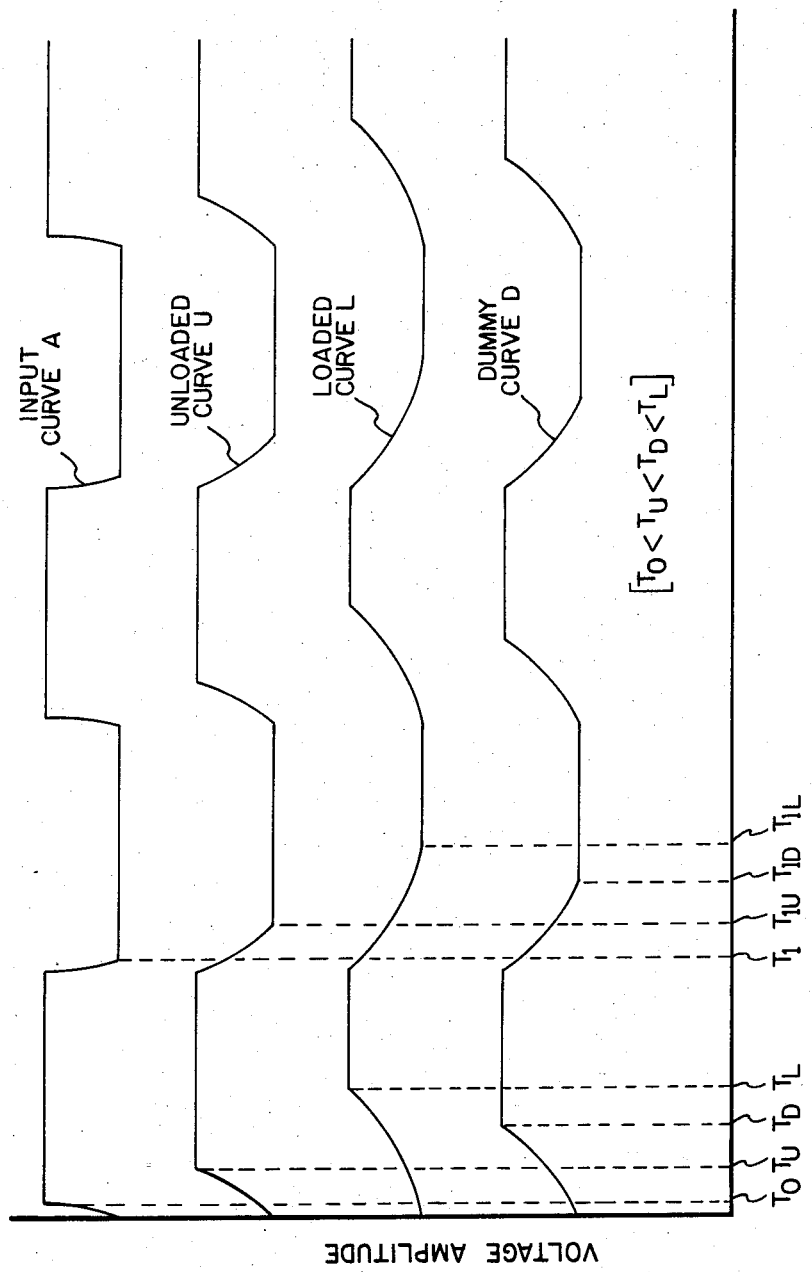
FIG. 5 is a timing diagram illustrating certain waveforms of the circuit of FIG. 3.

If the output of driver 16 is operating into a normal load, a clock voltage will always be present at the C input to the flip-flop 26 after the leading edge of the voltage to the D terminal from the dummy driver 28 occurs, since the loaded voltage waveform curve L will be slower than that of the dummy circuit, as illustrated in comparison of the curve L and the curve D of FIG. 5.

On the other hand, if the actual circuit is unloaded, such as by the disconnection of bonding wire 7 from the output terminal pad, thus removing the load capacitor C1, the voltage waveform from the output of driver 16 is speeded up and the leading edge will occur at an earlier time $T_U$ as indicated by curve U of FIG. 5. This earlier time, is prior to the leading edge of curve D, i.e., which is the output signal of the dummy circuit output driver 28. Coincidence will therefore not occur between the high of waveform D and the presence of a clock pulse at input lead C of error monitor flip-flop 26. Thus, in accordance with Table 1, a zero voltage will occur at the output lead Q of the flip-flop indicating a defect in the output circuit of the chip.

This output signal from each load detector circuit 22 may be coupled, along with the output signal from each of the input activity detector circuits 20, to NAND gate 24 (as shown in FIG. 1) and NAND'D together to provide a zero output if any of the outputs of the detector circuits 20 and 22 are at a zero voltage level indicating a defect in either the input or output circuits of the chip.

The output of NAND gate 24 is a "One" if any input is a "Zero", thus indicating a defect or fault. If no fault is indicated, all inputs are ONE's and the output is a "Zero". The output is coupled to fault monitor pad 18' which is similar to output pads 18, above referenced. From pad 18', the output signal is coupled to output terminal 2 of the chip 10. An external voltage dropping resistor 80 is coupled to pin 2 on one side and to a positive reference voltage $V_{DD}$. If the fault monitor pad 18 is detached between NAND gate 24 and resistor 80, an open circuit fault condition exists. When this occurs, resistor 80 pulls the pin 2 to $+V_{DD}$ indicating a "ONE" or defect condition. If all the output pads 18 and 18' are connected, pin 2 has a "Zero" output signifying no fault.

Figure 4:
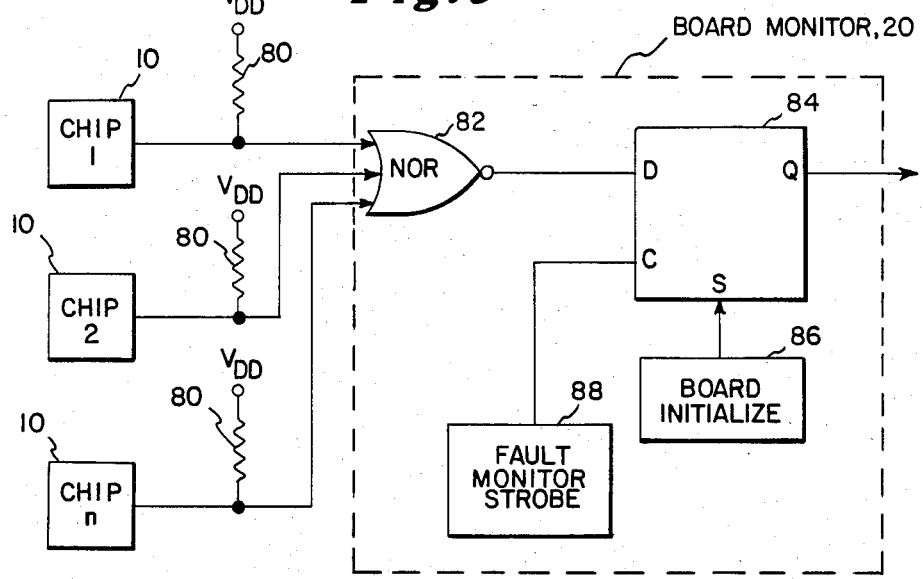
FIG. 4 is a block diagram illustrating the on chip defect detector circuits interconnected to a board monitor circuit 90 which monitors all of the chips on a board.

Each of the outputs from pin 2 of the chip circuits 10 on a board are coupled in parallel to a board monitor circuit 90, as shown in FIG. 4. Three such outputs from chips 1, 2 and n are shown coupled to NOR gate 82. If any inputs to NOR gate are ONE's, indicating a fault, the output of NOR gate 82 is a "Zero", signifying a fault. If all inputs are "Zero", a "One" output signal occurs, indicating no fault.

The output of NOR gate 82 is coupled to the D input of D-type flip-flop 84 which is provided with clock pulses from fault monitor strobe 88, when it is desired to check the fault status of the chips. The S input to flip-flop 84 is provided by board initialize circuit 86 when the circuits are initially energized. The flip-flop 84 generates a "One" output in response to the coincidence of clock pulses at C and a "One" or HIGH at terminal D, signifying "no fault" or a "Zero" output, if any input or output pad on any chip is disconnected.

EQUIVALENTS

While the invention has been particularly shown and described with reference to a preferred embodiment thereof, it will be understood by those skilled in the art that various changes in form and detail may be made therein without departing from the spirit and scope of the invention.

What is claimed is:

1. A circuit chip defect detection system for detecting open circuits associated with chip output pads wherein signals from chip output circuits are coupled to chip output pads and from the output pads to external apparatus; comprising:
    (a) an output circuit defect detector having:
        (i) a dummy circuit comprising a scaled-down version of the output circuit coupled to the input of said output circuit, the time constant of such dummy circuit being less than the time constant of the output circuit but greater than the time constant of the output circuit when the output circuit is disconnected from said chip output pad; such that the output signal from the dummy circuit occurs before the output signal from the output circuit unless the output pad is disconnected from the external apparatus;
        (ii) timing means having a first input terminal and a second input terminal for providing an output signal of one of two possible states depending upon which of the following conditions occur:
            (1) the signal on the first input terminal occurs before the signal on the second input terminal indicating an open circuit defect;
            (2) the signal on the first input terminal occurs after the signal on the second input terminal; and;
        (iii) coupling means for coupling the output signal of the dummy circuit to the second input terminal and the output signal of the actual output circuit to the first input terminal.

2. A circuit chip defect detection system for detecting open circuits associated with chip input pads wherein external input signals of predetermined frequency are coupled to the chip input pads; comprising:
    (a) an input circuit defect detector having:

(i) an integrator circuit coupled to the chip input pad for integrating the input signals over the predetermined time period of said input signal;

(ii) comparator means for comparing the integrated signal with a predetermined reference signal and providing an output signal of one of two possible states depending upon whether the integrated signal is less than the reference signal or is equal to or greater than the reference signal.

3. A circuit chip defect detection system for detecting open circuits associated with chip input or output pads wherein signals from chip output circuits are coupled to chip output pads and from the output pads to external apparatus and wherein external input signals of predetermined frequency are coupled to the chip input pads; comprising:

(a) an output circuit defect detector having:
  (i) a dummy circuit which is substantially similar to said output circuit on a smaller scale, said dummy circuit being coupled to the input of said output circuit, the time constant of such dummy circuit being less than the time constant of the output circuit but greater than the time constant of the output circuit when the output circuit is disconnected from said chip output pad, such that the output signal from the dummy circuit occurs before the output signal of the output circuit unless the output pad is disconnected from the external apparatus;
  (ii) timing means having a first input terminal and a second input terminal for providing an output signal of one of two possible states depending upon which of the following conditions occur:
    (1) the signal on the first input terminal occurs before the signal on the second input terminal indicating an open circuit defect;
    (2) the signal on the first input terminal occurs after the signal on the second input terminal;
  (iii) coupling means for coupling the output signal of the dummy circuit to the second input terminal and the output signal of the output circuit to the first input terminal; and (b) an input circuit defect detector having:
  (i) an integrator circuit coupled to the chip input pad for integrating the input signals over the predetermined time period of said input signal; and
  (ii) comparator means for comparing the integrated signal with a predetermined reference signal and providing an output signal of one of two possible states depending upon whether the integrated signal is less than the reference signal or is equal to or greater than the reference signal.

4. The apparatus of claim 1, including means for coupling the output signals from each timing means on a chip to a gate circuit which provides an output signal indicating a fault, if all input signals are not in the first of two possible states, and an output signal indicating no fault, if all input signals are in the first of two possible states.

5. The apparatus of claim 2, including means for coupling the output signals from each comparator means on a chip to a gate circuit which provides an output signal indicating a fault, if all input signals are not in the first of two possible states, and an output signal indicating no fault, if all input signals are in the first of two possible states.

6. The apparatus of claims 4 or 5 in which the output signal of the gate circuit is coupled to a fault monitor pad on the chip and the fault monitor pad is coupled to a fault monitor output pin which is connected to a reference voltage through a resistor such that if the fault monitor pad is disconnected, the voltage at the output pin will rise to a voltage level indicating a fault.

7. The apparatus of claim 6 in which each fault monitor pin is coupled to a board monitor circuit which includes gating means to provide a fault indication if any inputs to the gating means from the fault monitor pins are not in the same one of two possible states.

8. A circuit chip defect detection system of detecting open circuits associated with chip output pads wherein chip output circuits are coupled from the chip to external apparatus and wherein the chip output circuits comprise MOSFET type driver amplifiers; comprising:

(a) an output circuit defect detector having:
  (i) a dummy circuit comprising a MOSFET type driver amplifier with a time constant $T_D$ less than the time constant of the output circuit when connected to an output pad, the input of said dummy circuit being coupled to the input to said output circuit, said dummy circuit operating into a dummy load capacitance less than the actual load capacitance imposed by the chip output pad but greater than the output circuit capacitance when the chip output pad is disconnected from the external apparatus;
  (ii) a timing means having a first input terminal and a second input terminal for providing an output signal of one of two possible states depending upon whether the following condition occurs: the signal on the first input terminal occurs before the signal on the second input terminal indicating the presence of an open circuit defect and for providing the opposite output state when the opposite condition occurs;
  (iii) coupling means for coupling the output of the dummy circuit to the second input terminal and the output of the output circuit to the first input terminal.

9. The apparatus of claim 8, including:
(a) chip input pads wherein input signals of predetermined frequency are coupled to said chip input pads; and
(b) an output circuit defect detector having:
  (i) an integrator circuit coupled to the chip input pad for integrating the input signals over the predetermined time period of said input signal;
  (ii) comparator means for comparing the integrated signal with a predetermined reference signal and providing an output signal of one of two possible states depending upon whether the integrated signal is less than the reference signal or is equal to or greater than the reference signal.

10. A method for detecting open circuits associated with chip output pads wherein signals from chip output circuits comprising driver amplifers are coupled to chip output pads and from the output pads to external apparatus; comprising the steps of:

(a) coupling a dummy circuit to the input of said output circuit in which the dummy circuit is a scaled-down version of the chip output circuit's driver amplifiers, and the time constant of such dummy circuit being less than the time constant of the output circuit but greater than the time constant of the output circuit when the output circuit is disconnected from said chip output pad; such that the output signal from the dummy circuit occurs before the output signal from the output circuit unless the output pad is disconnected from the external apparatus;

(b) providing an output signal of one of two possible states depending upon which of the following conditions occur:

(i) the signal at A occurs before the signal at B;

(ii) the signal at A occurs after the signal at B; and (c) coupling the output signal of the dummy circuit to B and the output signal of the actual output circuit to A and wherein A is not equal to B.

11. An output circuit fault monitoring circuit in which a dummy circuit is connected to the output circuit which dummy circuit is a scaled-down version of the output circuit and has a time delay intermediate that of the output circuit operating into a connected output pad and that of the output circuit when operating into a disconnected output pad; and means for determining the time of arrival of the dummy circuit signal in relation to that of the actual output signal to indicate the presence or absence of a disconnected output pad.

* * * * *